United States Patent

[11] 3,630,804

[72] Inventors Frederick E. Coffman
State College;
Blair W. Heffner, Petersburg, both of Pa.

[21] Appl. No. 753,477
[22] Filed Aug. 19, 1968
[45] Patented Dec. 28, 1971
[73] Assignee Chemcut Corporation
State College, Pa.

[54] ETCHING APPARATUS
22 Claims, 9 Drawing Figs.

[52] U.S. Cl. .......... 156/345, 134/153
[51] Int. Cl. .......... H01l 7/00, C23f 1/02
[50] Field of Search .......... 156/3, 17, 345; 134/80, 153, 48, 50, 72, 81, 95, 121

[56] References Cited
UNITED STATES PATENTS
3,406,697 10/1968 Mitchell et al. .......... 134/148

*Primary Examiner*—Jacob H. Steinberg
*Attorney*—Paul & Paul

ABSTRACT: An apparatus is provided for etching articles, in particular, for etching wafers in accordance with the production of semiconductor devices. The apparatus employs a rotatable conveying device for traversing wafers carried thereby through a spray of acid, neutralizer, water or the like, for a portion of the cycle of operation of the apparatus, the wafers then being air dried during a further portion of the cycle of operation of the apparatus, the air drying cycle generally being conducted at a high speed.

INVENTORS.
Frederick E. Coffman
Blair W. Heffner
BY
Paul + Paul
ATTORNEYS.

INVENTORS.
Frederick E. Coffman
Blair W. Heffner
BY
Paul + Paul
ATTORNEYS.

INVENTOR.
Frederick E. Coffman
Blair W. Heffner
BY
Paul + Paul
ATTORNEYS.

INVENTORS.
Frederick E. Coffman
BY Blair W. Heffner
Paul + Paul
ATTORNEYS.

ETCHING APPARATUS

BACKGROUND OF THE INVENTION

Various techniques have been developed in the etching art, particularly with regard to the etching of semiconductor wafers. Such techniques generally involve the immersion of the wafers or other articles to be etched into a bath of etchant. The wafers thus immersed are generally held in an inert work holder (i.e., inert to the etchant) and are dipped vertically into a bath of etchant. Such oxide etching processes generally have resulted in problems in controlling the bath temperature of the etchant, as well as in agitation, depletion and replacement of the etchant. Also, the personal safety of the personnel conducting a dipping type of etching operation has resulted in a problem to which the present invention is also particularly addressed.

SUMMARY OF THE INVENTION

The present invention is directed toward providing a novel apparatus for receiving wafers to be etched in a cabinet which is closable to the operator, the wafers being placed on a seating pin arrangement which is rotatable such that the wafers are passed beneath a spray of etchant in serial fashion, then under a spray of neutralizer, and subsequently under a spray of water, all such sprays emanating from the same nozzle located in a common zone of the closed chamber in which the wafers are rotated. The pins of the rotatable disc which hold the wafers in position are so arranged that the wafers are oriented for opposing both centrifugal and aerodynamic lifting forces which may otherwise act upon the wafers during their rotation. After the wafers have been etched, neutralized and washed, the etching zone may be washed and cleaned with water or the like, while the wafers continue to rotate. The wafers are then rotated at a higher speed in an air medium for drying the wafers, such high speed of the rotating disc being provided by an air turbine.

Accordingly, it is a primary object of this invention to provide a novel apparatus for etching articles, such as wafers, wherein the wafers are contained within a chamber wherein etchant spray is applied to the wafers, along with other treating fluid, during rotation of the wafers.

It is a further object of this invention to accomplish the above object, wherein a particular portion of the chamber is openably closed from the remainder of the chamber to define an etching zone of the chamber under which wafers or other articles may be passed during rotation of the wafer-carrying device.

It is a further object of this invention to accomplish the above objects, wherein the chamber is partially defined by an openable hood which concurrently places the etching zone of the chamber into communication with the remainder of the chamber upon opening the hood for access to the chamber.

It is another object of this invention to accomplish the above objects, wherein the wafer-carrying device is a rotatable disclike member having a number of perforate plates carried at the periphery thereof, with a unique seating arrangement being provided by the plate for a desired orientation of the wafers during etching and drying thereof.

It is a further object of this invention to accomplish the above objects, wherein a novel spray arrangement is provided for the etchant, neutralizer fluid, and water in the etching zone of the chamber of this invention.

It is yet another object of this invention to accomplish the above objects, wherein a novel high-speed drying arrangement is provided for wafers etched according to the etching process of this invention.

Other objects and advantages of the present invention will become readily apparent to one skilled in the art from the following brief description of the drawing figures, the detailed description of the preferred embodiment and the appended claims.

Figure 1:
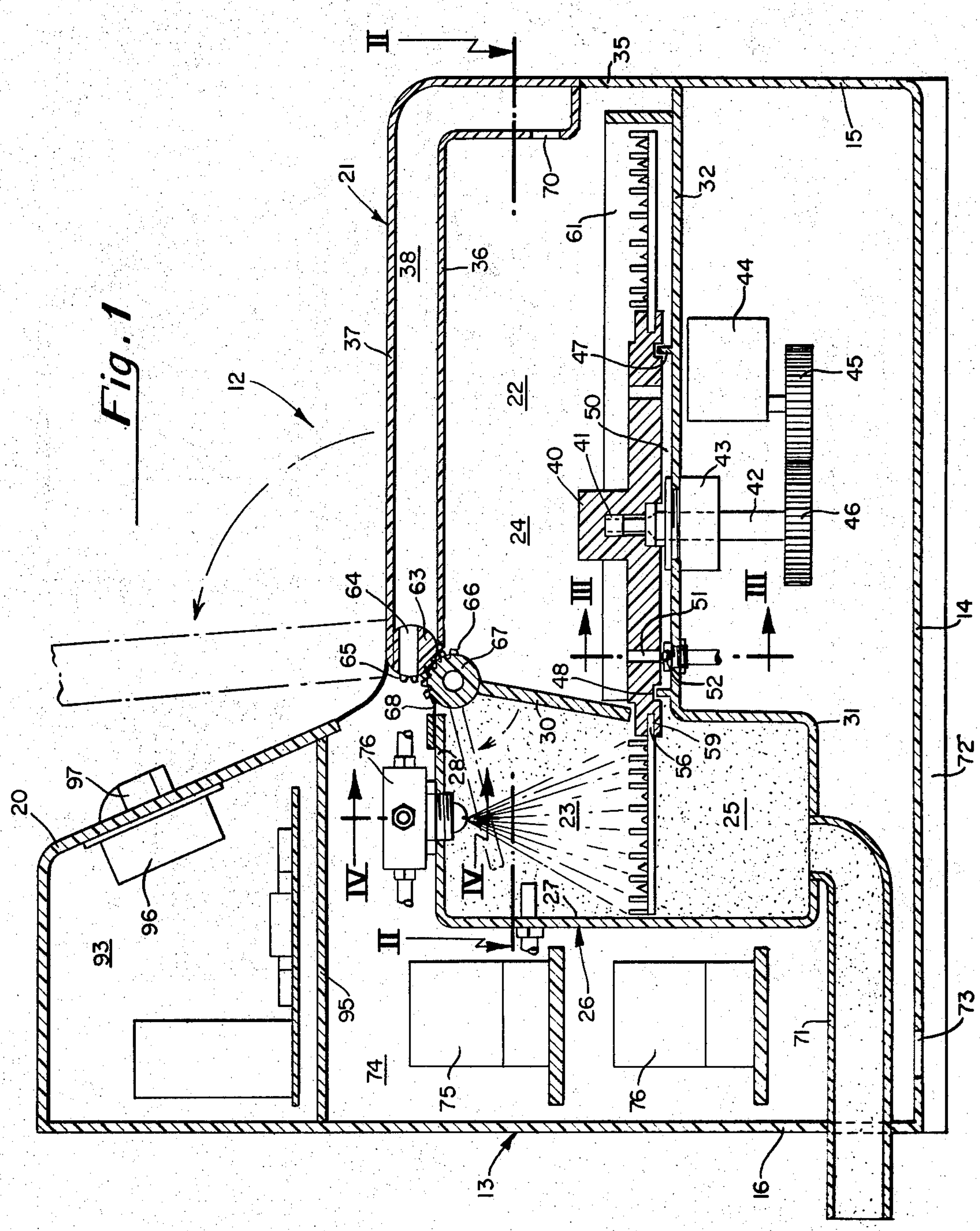
FIG. 1 is a vertical sectional view through the apparatus of this invention, wherein the major components thereof are clearly illustrated with the openable hood being illustrated in both full line and phantom positions, to illustrate respectively the closed and open positions of the hood.
Figure 3:
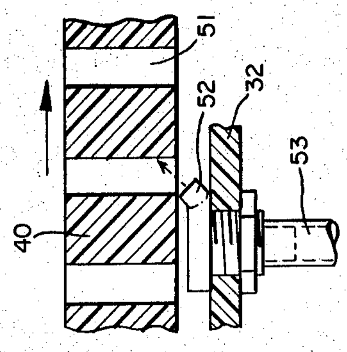
FIG. 3 is an enlarged fragmentary detailed sectional view of a portion of the rotatable plate and its compressed air turbine drive arrangement for high-speed rotation of the rotatable disc, taken generally along the line III—III of FIG. 1.

Referring now to the drawings in detail, reference is first made to FIG. 1, wherein there is illustrated the apparatus of this invention generally designated by the numeral 12, and comprising a cabinet 13 and internal working components thereof.

The cabinet 13 includes a bottom wall 14, front and rear walls 15 and 16, respectively, sidewalls 17 and 18, top wall 20 and a pivotally movable hood 21.

A chamber 22 is provided inwardly of the cabinet 13, comprising a spraying zone 23, a dry zone 24, and an exhaust zone 25.

The spraying zone is defined by a shell-like structure 26 comprising a vertical partition 27, a horizontal partition 28, the sidewalls 17 and 18, and a pivotally movable baffle 30, with the zone 23 terminating at its lower end at the path of traversal of wafer plates (to be later described herein) which separate the zones 23 and 25.

The zone 25 is defined by a structure of generally U-shaped section 31, as viewed in section in FIG. 1, between the sidewalls 17 and 18. A horizontal partition 32 connects the uppermost end of structure 31 with the front wall 15 of the cabinet 13.

The zone 24 is defined between the sidewalls 17 and 18, the pivotally movable baffle 30 and upstanding portion 35 of the front wall 15, the horizontal partition 32, and a lower surface portion 36 of the pivotally movable hood 21.

The hood 21 is constructed of an outer wall 37 and an inner wall 36, defining therebetween an air duct 38, for a purpose later to be described.

A rotatable disc 40 is carried by the horizontal partition 32, being mounted for freedom of rotation by suitable bearings 41, and being drivable by a shaft 42 extending to the plate or partition 32, the shaft 42 being sealed by a suitable packing or sealing device 43. The shaft 42 is suitably driven by a drive motor 44, connected to the shaft 42 by a pair of drive gears 45 and 46, for providing the desired speed of rotation of the disc 40.

A circular upstanding ridge 47 is provided extending into an annulus 48 on the undersurface of the disc 40 for providing a seal for retarding the passage of air from a zone 50 beneath the center of the disc 40, outwardly of the upstanding ridge 47.

Figure 2:
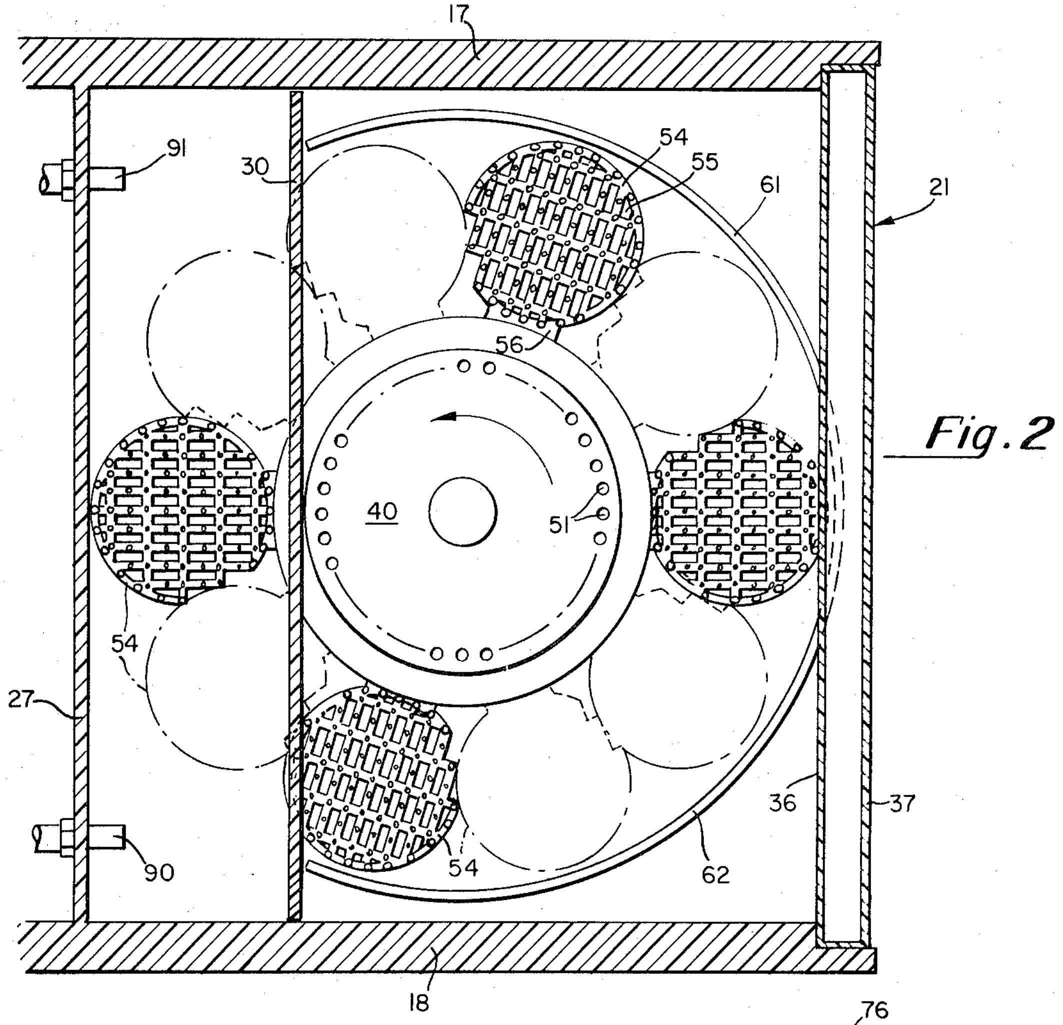
FIG. 2 is a sectional view through the apparatus of this invention, taken generally along the line II—II of FIG. 1, and wherein the configuration of the rotatable disc arrangement of this invention with its attached wafer-carrying plates and supporting pins are clearly illustrated.

A plurality of bore holes 51 are provided, in circular arrangement extending vertically through the disc 40 as illustrated in FIGS. 1 and 2, disposed above an air turbine nozzle 52. The nozzle 52 is mounted on and carried by the partition 32 and is connected via an air supply line 53 to a source of compressed air for driving the rotatable disc 40 at a high rate of speed, during a drying cycle of the apparatus 12 of this invention by directing a jet of pressurized air from the nozzle 52 toward the bore holes 51, as the disc 40 rotates thereabove. It will be noted that the bearings 41 are spin bearings or any other type of bearing arrangement which will provide a positive drive for the disc 40 from the motor 44 when desired, but which will permit an overdrive of the disc 40 by means of the turbine nozzle 52, when it is desired to rotate a disc 40 at a high rate of speed, in which instance the drive from the motor 44 may be cut off, and the disc 40 driven as an idler disc.

A plurality of generally circular plates 54 are provided, the plates 54 being perforate by means of a large number of slotted holes 55 or the like, and with each plate 54 having a lip 56 extending from the side of for engagement within a suitable annular slot 59 in the periphery of the disc 40, as illustrated in FIG. 1.

A plurality of peripherally disposed pins 57 extend upwardly from each plate 54, defining in the aggregate, a generally cagelike configuration. A plurality of wafer-holding pins 58 are also provided extending upwardly from the disc 54, with the uppermost ends of the pins 58 terminating in apices for holding wafers 60 to be retained thereon with minimum contact area, the upper ends of the pins 58 defining in the aggregate a surface which is tilted or sloped slightly toward the forward direction of rotation, as indicated by the counterclockwise direction of rotation indicated by the arrow in FIG. 2 and also sloped toward the center of the disc 40 as viewed in plan in FIG. 2.

Figure 6:
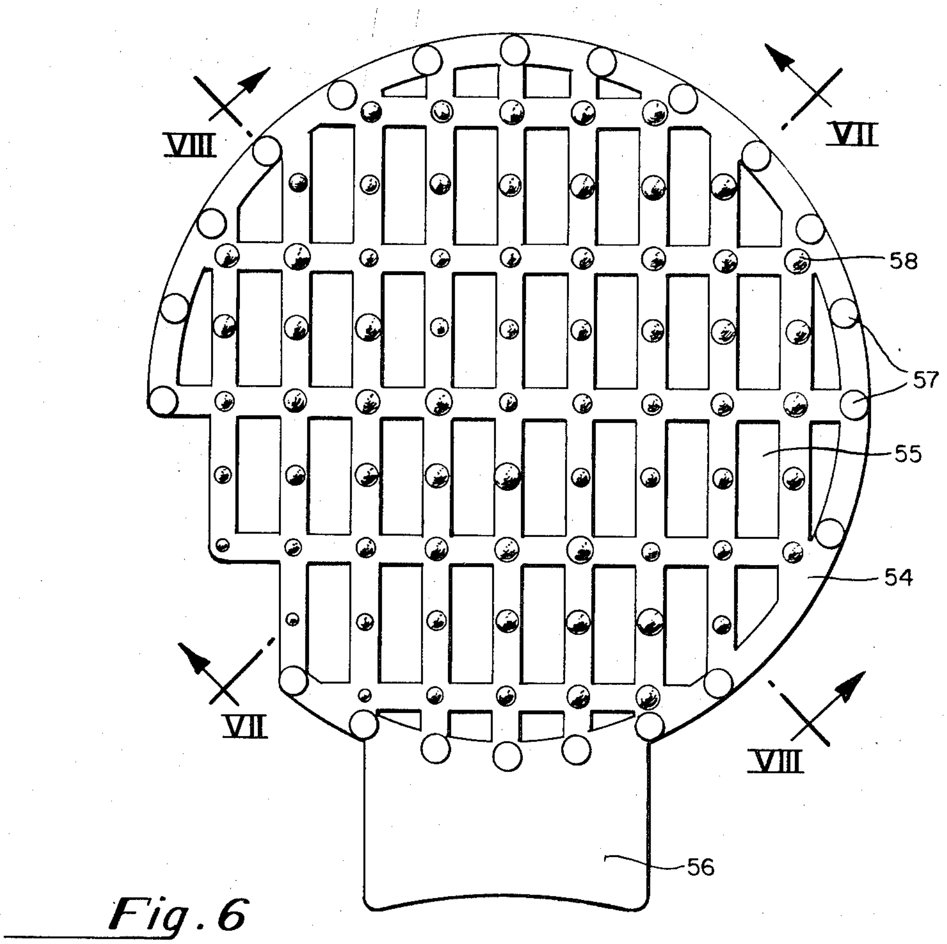
FIG. 6 is an enlarged plan view of one of the wafer-carrying plates of this invention, wherein the perforate plate construction and supporting pins thereof are clearly illustrated.
Figure 7:
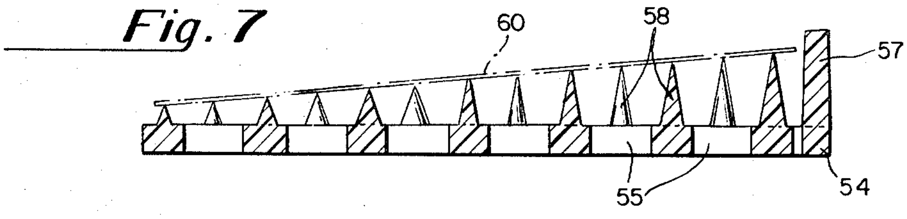
FIG. 7 is a transverse sectional view of the plate of FIG. 6, taken generally along the line VII—VII of FIG. 6, wherein the doubly tilted disposition of a wafer which would be carried by the uppermost ends of the pins of the plate is clearly illustrated.
Figure 8:
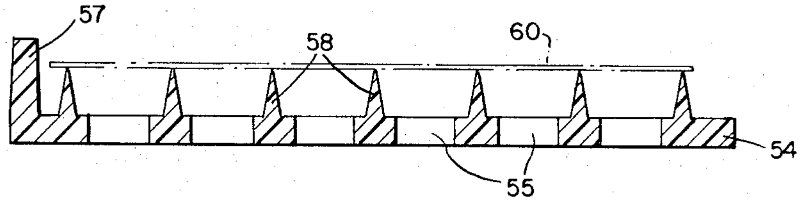
FIG. 8 is a sectional view through the plate of FIG. 6, taken generally along the line VIII—VIII of FIG. 6, and illustrates further the angular orientation that a flat disc would have when disposed upon the pins illustrated in plan as in FIG. 6.

With particular reference to FIGS. 6 through 8, it is seen that a wafer 60 carried on the pins 58 is tilted with its upper right end as viewed in FIG. 6 upwardly and with the lower left end downwardly about what may be described as an axis taken along the line VIII—VIII in FIG. 6, with this line VIII—VIII being orientated when viewed in plan in FIG. 6 at an angle of approximately 45° with a radial line from the center of the disc 40 passing through the center of the plate 54.

A curved arcuate guard 61 comprises a splash ring, for confining treating fluid propelled from wafers 60 carried on pins 58 during rotation of the disc 40 and to generally confine such splashed treating fluid inwardly thereof.

The pivotal hood 21 is movable between the full line position illustrated in FIG. 1 and the phantom line position illustrated therein and is carried by a pivot rod 63 which, in turn, is carried by opposite sides 17 and 18 of the cabinet 13. The pivot rod 63 connects outer and inner walls 37 and 36, respectively, of the hood 21 at the leftmost end thereof, as viewed in FIG. 1, and is provided with one or more air passages 64 therein. The rod 63 carries gear teeth 65 secured thereto which are engageable with mating gear teeth 66 of a shaft 67 which carries the baffle 30, the shaft 67 also being carried between the sidewalls 17 and 18 of the cabinet 13.

A fluid seal 68 is provided connecting the shaft 67 and the partition portion 28, to prevent leakage of etchant, neutralizer or water out of zone 23 of the chamber 22 during operation. The pivoting of the hood 21 to an open position is operative through the gear teeth 65 and 66 to pivot the baffle 30 to the phantom position illustrated in FIG. 1, for access to the zone 23 of the chamber 22.

The surface 36 of the hood 21 is provided with an air duct opening 70, opening into the zone 24 of chamber 22, at the rightmost side thereof as viewed in FIG. 1. A vent and drain duct 71 is provided from the bottom of the structure 31 which forms the exhaust zone 25 for draining the various treating fluids from the chamber 22.

A passage 72 is provided beneath the bottom partition 14 of the cabinet 13 for receiving air passing therethrough upwardly through an opening 73 in the floor 14, around the drain 71 and through a control zone 74 which houses solenoid valves 75, 76 and the like for delivery of air through the ports 64, through the duct 38, and through the opening 70 into the drying zone 24 of the chamber 22, for a purpose later to be described.

A spray nozzle 76 is provided, carried by the upper wall 28 of the spray zone 23 of the chamber 22, with the nozzle 76 including an inlet 77 for compressed air and inlets 78, 80 and 81 for an etchant such as an acid, a rinse generally in the form of a neutralizing fluid, and a further rinse such as water, respectively.

The nozzle 76 includes a base member 82, an intermediate member 83, and a nozzle diffuser member 84 with the members 83 and 84 being connected by a suitable threaded fastener 85, which is threadably carried within the partition 28. Each of the fluid inlets 78, 80 and 81 are connected to a common duct 86 which is in communication with the outlet opening 87 of the nozzle 76, and a duct 88 is provided for delivering air from its inlet 77 to the nozzle diffuser outlet opening 88 and creating a venturi effect for drawing the desired treating fluid from one of the inlets 78, 80 and 81 through the nozzle diffuser opening 87.

A pair of chamber flush nozzles 90 and 91 are provided carried by the vertical partition wall 26 for flushing the spray zone 23 of the chamber 22 clear of acid, neutralizer fluid or the like, as desired. Suitable water connections or the like (not shown) may be provided, connected to water supply lines, as desired.

An electrical zone 93 is provided, generally above the zone 74 and separated therefrom by a partition 95 extending between sidewalls 17 and 18 and rear wall 16 of the cabinet 13, also being connected at its rightmost end as viewed in FIG. 1 with the downwardly extending portion of the cabinet upper wall 20 to secure electrical components (unnumbered) within the zone 93 in airtight relationship relative to the remainder of the apparatus 12. A timer 96 with an outer setting knob 97 therefor is carried on the downwardly sloped portion of the wall 20 for setting the desired cycle of operation of the apparatus 12 in a manner later to be described herein.

Figure 5:
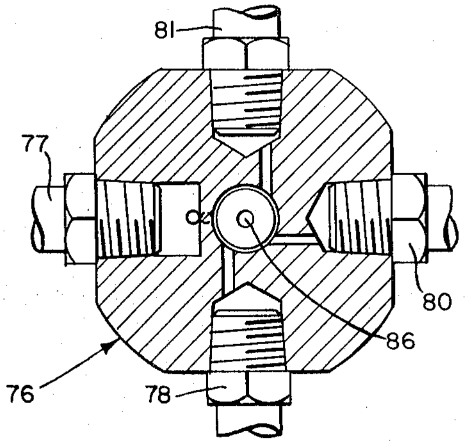
FIG. 5 is a sectional view through the spraying nozzle of this invention taken generally along the line V—V of FIG. 4, and wherein additional details of the nozzle construction are clearly illustrated.
Figure 4:
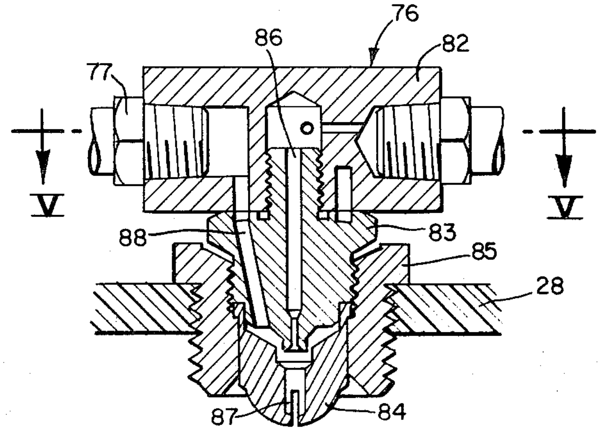
FIG. 4 is an enlarged transverse sectional view of the spraying nozzle of this invention taken generally along the line IV—IV of FIG. 1, and wherein the details of construction thereof are clearly illustrated.
Figure 9:
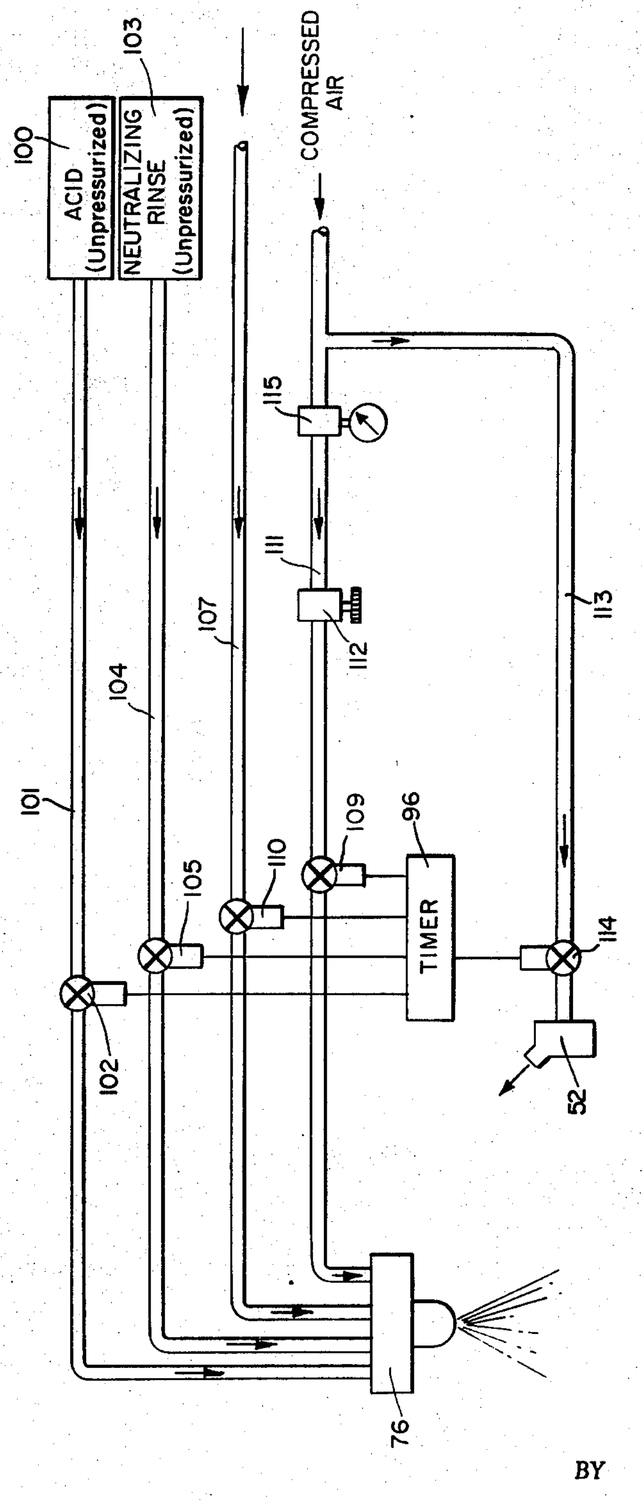
FIG. 9 is a schematic view illustrating the supply of fluids to the nozzle of this invention, and the regulation and control means therefor.

With particular reference of FIG. 9, the various control devices of this invention are schematically illustrated in simplified form. It will be noted that the nozzle 76 is provided with an etching fluid (generally acid) from an unpressurized source 100, through a supply line 101 which may be opened or closed by actuation of a solenoid 102 to permit passage of the acid into the nozzle 76 through the duct connection 78, as viewed in FIG. 5. Similarly, a neutralizing rinse 103 is provided from an unpressurized source through a supply line 104 to the nozzle 76, but wherein a solenoid 105 is disposed in the line 104 for precluding or permitting the passage of neutralizing rinse to the nozzle 76 as desired. Pressurized water is fed into a line 107 to the nozzle 76. A solenoid 110 is also connected in the line 107 for permitting or excluding pressurized water delivery relative to the nozzle 76 as desired.

Compressed air is provided from a suitable source (not shown) to a line 111, which is provided with a suitable air spray regulator 112 for controlling the feed of air to the nozzle 76. The regulator 112 is manually actuable and would normally be mounted externally of the cabinet 13 for ease of operation by an operator. Compressed air is also provided through a line 113 for delivery to the turbine spinner nozzle 52 and released therefrom in the form of a jet for rotation of the disc 40, in the manner above described. A solenoid 114 in the line 113 also controls the actuation of compressed air through the nozzle 52, and consequently controls the high-speed rotation of the rotatable disc 40, such rotation being permitted to the extent that the solenoid valve 114 is open.

A pressure gauge 115 may also be provided in the line 111, if desired, to maintain constant control over the air pressure being supplied to the nozzle 76.

All of the solenoids 102, 105, 109, 110 and 114 are controlled by the timer 96, which may be set to a desired cycle. The solenoid 109 shuts off the air supply to the nozzle 76 when the machine is not operating.

OPERATION

In accordance with this invention, the wafers which are desired to be etched are placed on the plates 54, which wafers are generally of this silicon construction, to be carried on the pins 58 thereof as illustrated in FIGS. 6 to 8. As the apparatus 12 is being loaded, the hood 21 is generally in the open position illustrated in phantom lines in FIG. 1, and the baffle 30 is also in its open position. Upon closing the hood 12, the spray zone 23 is effectively sealed from the drying zone 24, and the timer 96 is set to initiate the spray of an acid through the nozzle 76 and onto the wafers which will traverse the path of spray from the nozzle 76. At the commencement of the spraying of etchant or etching acid from the nozzle 76, the disc 40 is rotated by actuation of the motor 44 (which may also be controlled by the timer 96 if desired).

As the wafers 60 pass serially beneath the spray from the nozzle 76, they are sprayed by the etchant in successive fashion throughout multiple passes of each plate 54 through the spray zone 23, for a predetermined period of time, as set by the timer 96. During this rotation of the wafers 60 by means of the rotation of the disc 40, the particular orientation of the wafers 60 on the pins 58 in the manner mentioned above overcomes the tendency of the wafers 60 to be thrown or lifted from the pins 58 by a combination of centrifugal and aerodynamic forces.

As the etchant spray cycle is completed, and during continued rotation of the disc 40, a flushing fluid (generally water) is dispersed through the flushing nozzles 90 and 91 to wash the spraying zone 23 of the chamber 22 for removal of all etchant from the walls thereof.

A timing circuit component (not shown) of the timer 96, which has opened the solenoid 102 and consequently prohibited passage of further etchant through the line 101 to the nozzle 76 now is operative, as set by the timer 96, to actuate the solenoid 105 to open the line 104 permitting flow of a neutralizing rinse to the nozzle 76, such neutralizing rinse generally being a base liquid. A subsequent water-flushing operation is automatically effected by the timer 96, wherein water is again dispersed throughout the nozzles 90 and 91 to wash the neutralizing rinse from the walls of the spraying zone 23. If desired, in the alternative or in addition, the rinse may be water fed through the line 107 when such line is opened by actuation of the solenoid 110 by the timer 96, such that water is delivered to the nozzle 76 to be sprayed into the spraying zone 23.

It will be noted that the pressurized air delivered into the port 77 of the nozzle 76 and outwardly through the nozzle dispersion opening 87 provides venturi effect in creating a partial vacuum which draws the treating fluid, be it acid, neutralizing fluid or water, from its appropriate line, through the nozzle 76 and into the spraying zone 23.

At the termination of all spraying portions of the cycle, the timer 96 may then actuate the solenoid 114 which will permit the flow of pressurized air through the spinning nozzle 52, causing a turbine action against the rotatable disc 40 by the pressurized air from the nozzle 52 engaging the holes 51 of the rotatable disc 40. This turbine action against the rotatable disc 40 causes an overrunning of the disc relative to its shaft 42, in that the light friction positive drive of the disc 40 ceases to drive the disc 40, and the disc 40 enters into an "overdrive" speed of revolution at a substantially high speed relative to its speed during the spraying operation. During such high-speed rotation, the etched wafers 60 are air dried by air entering the drying zone 24 of the chamber 22 through the duct 38 in the hood 21 and the opening 70 in the surface 36 of the hood 21.

A vent is provided, attached to the exhaust line 71, which creates a suction through the exhaust system, such a vent drawing from the line 71 approximately 20 cubic feet per minute at 1 inch of water gauge. This draft is constant, and facilitates the downward spraying of any given fluid from the nozzle 76, causing a wet space in the triangular area indicated in FIG. 1 just above that plate 54 which is disposed below the nozzle 76, also causing a semiwet space in the remainder of zone 23 above the wet space with a semiwet space also prevailing within the structure 31 and exhaust line 71. It will be noted that the wet zone is indicated by straight lines emanating from the lowermost end of the nozzle 76 in FIG. 1 and that the semiwet space is indicated by a "stippled" area of the drawing of FIG. 1. Additionally, the remainder of the chamber 22 is designated a dry space, or zone, with the exception of that portion of the zone 24 at the lowermost end of the zone 24 in the vicinity of the pins 58 and plates 54.

The exhaust through the line 71 also draws air from the zone 50, over the restricting ridge 47 around the lowermost end of the baffle 30 and through the opening 70 in the inner surface 36 of the hood 21. The partial vacuum creating the air thus entering the zone 24 is first drawn through the opening 73 in the bottom plate 14 of the cabinet 13, through the zone 74, through the holes 64, and through the duct 38 to pass into the zone 24 through the opening 70. This passage of normally dry air, in cooperation with the high speed of rotation of the wafers 60 on the plates 54 attached to the rotatable disc 40 facilitates the drying of the wafers 60. This drying operation is referred to as the spin cycle because of the high rate of speed of the rotatable disc 40 during such cycle.

It will be noted that the spray pressure is controlled by the spray air regulator 112 connected in the air line 111 to the nozzle 76. The pressure gauge 115 in the line 111 also enables a visual indication of the pressure in the line 111.

It will further be noted that the various materials facilitating storage and delivery of the etchant and neutralizing liquids should be inert to such liquids conveyed and thus in many instances it will be desirable to utilize tubing and containers of polyethylene construction. It will further be desirable to construct the entire cabinet and particularly the walls of the chamber 22 and most particularly the zones 23, 25 and the exhaust line 71 of an inert material. It is also contemplated that the water fed through the flushing nozzles 90 and 91 as well as to the nozzle 76 may be deionized to eliminate undesirable reactions.

In the embodiment illustrated, it will be apparent that the particular rotatable disc 40 has 10 plates 54 and therefore may receive 10 wafers 60 for etching during a single operation. Also, the wafers 60 which are to be etched may vary in size, as desired, limited only by the size limitation of the plates 54. The entire cabinet is preferably constructed of acid-resistant plastic, although, as it has been set forth above, only those structures which are most closely related to the spraying zone 23 need actually be inert to acids and the like.

It is contemplated that solid-state timing devices be utilized for the timer 96, wherein selected variations are permitted in the etch, rinse and wash cycles to meet requirements under specific conditions. It is further contemplated that the cycles range from 30 seconds to 10 minutes for an etch cycle and for 10 seconds to 2 minutes for a rinse cycle.

Additionally, it may be desirable to utilize a vent having 25 cubic feet per minute flow at approximately 1 inch of water gauge pressure, or other, greater vent suction depending upon the necessary application. Such additional variations which are further contemplated are the use of nitrogen rather than air for purposes of drying the wafers 60, or even the use of heated air or nitrogen, as desired. The timer 96 may be such that the cycles may be set for manual control if the same were desired, or for automatic control, depending upon the particular use contemplated.

In accordance with the purpose of this invention, it is readily seen that an apparatus of unitary construction is provided, for facilitating uniform spraying of wafers to be etched therein.

It will be apparent to those skilled in the art that various modifications may be made in the structural details, assembly, use and operation of the apparatus of this invention, all within the spirit and scope of the invention as defined in the appended claims.

We claim:

1. Apparatus for etching articles comprising a substantially closed chamber, a portion of said chamber comprising an etching zone, means for bringing an etching material into contact with articles to be etched in the etching zone and an article-carrying device mounted for rotation within the chamber and for movement of an article into, traversal of and movement out of said etching zone during rotation of said article-carrying device, including drive means for said article-carrying device, wherein said article-carrying device is a rotary device which includes perforate plate means carried on its periphery for traversal of said etching zone by said plate means during rotation thereof, with said plate means carrying upstanding pin means for engaging articles to be carried by said plate means, with minimum contact area of ends of said pin means on articles.

2. The apparatus of claim 1, wherein said etching zone comprises a portion of said chamber that is substantially closed relative to the remainder of said chamber, with confined opening means provided between said zone and the remainder of said chamber for entry of articles to be etched into said etching zone.

3. The apparatus of claim 2, wherein said etching zone is provided with a movable access opening.

4. The apparatus of claim 3, wherein, said chamber is partially defined by an openable hood comprising access means.

5. The apparatus of claim 4, wherein said etching zone is partially defined by a movable baffle.

6. The apparatus of claim 5, wherein means are provided for automatic movement of said baffle for access to said etching zone upon opening said hood for access.

7. The apparatus of claim 1, wherein said pin means have uppermost ends which aggregately define surface means for seating an article carried thereby in a partially forwardly facing direction relative to the direction of rotation of said plate means.

8. The apparatus of claim 1, wherein said pin means have uppermost ends which aggregately define planar surface means for seating a flat article carried thereby in a tilted partially forwardly facing direction relative to the direction of rotation of said plate means.

9. The apparatus of claim 8, wherein said surface means also provides for seating an article carried thereby in a tilted partially radially inwardly facing direction relative to the center of said disc member.

10. The apparatus of claim 1, wherein said pin means have uppermost ends which aggregately define surface means for seating an article carried thereby at an angular orientation for opposing both centrifugal and aerodynamic lifting forces acting upon an article due to rotation of said disc members.

11. The apparatus of claim 1, wherein said plate means comprise individual perforate disclike elements, each of substantially the diameter of a wafer-type article to be carried thereby.

12. The apparatus of claim 2, wherein spray means are provided in said etch zone for spraying an etching fluid on articles transversed therethrough.

13. The apparatus of claim 2, wherein means are provided in said etch zone for selectively spraying at least one of an etching fluid spray, a neutralizing fluid spray, or water spray on articles traversed therethrough.

14. The apparatus of claim 13, wherein said selective spraying means comprises a compressed air spraying device for dispersing any of said sprays in said etch zone.

15. The apparatus of claim 2, wherein a portion of said chamber comprises a drying zone, and means are provided for delivering drying fluid to said drying zone.

16. The apparatus of claim 15, wherein said means comprise air ducts.

17. Apparatus for etching articles comprising chamber means for housing articles to be etched, means within said chamber means for spraying articles with treating fluid in a treatment zone of said chamber means, and means for rotatably conveying articles to be sprayed into, through, and out of said treatment zone of said chamber means, wherein said rotatably conveying means includes perforate plate means carried on its periphery for traversal of said treatment zone by said plate means during rotation thereof, with said plate means carrying upstanding pin means for engaging articles to be carried by said plate means, with minimum contact area of ends of said pin means on articles.

18. The apparatus of claim 17, including means for air drying articles sprayed with treating fluid.

19. The apparatus of claim 18, including means for selectively actuating said spraying means and drying means.

20. The apparatus of claim 19, wherein said rotatable conveying means has plural speed drive means.

21. The apparatus of claim 20, wherein said drive means includes air turbine means for high speed driving of said conveying means.

22. The apparatus of claim 17, wherein a vent means is provided for drawing off treatment fluid from said chamber means, and with said chamber means being provided with partition means and air inlet means, that, in cooperation with said vent means, comprise means for dividing said chamber during spraying of treating fluid into a wet zone in direct contact with treating fluid being sprayed, a semiwet zone in indirect contact with treating fluid being sprayed, and a dry zone.

* * * * *